United States Patent [19]
Bonaccio et al.

[11] Patent Number: 5,410,186
[45] Date of Patent: Apr. 25, 1995

[54] PROGRAMMABLE DIGITAL TO ANALOG CONVERTER

[75] Inventors: Anthony R. Bonaccio, Shelburne; John E. Gersbach, Burlington, both of Vt.; Christian J. Goetschel, Rochester, Minn.; Sharon L. Von Bruns, Westford, Vt.

[73] Assignee: International Business Machines Company, Armonk, N.Y.

[21] Appl. No.: 206,689

[22] Filed: Mar. 4, 1994

Related U.S. Application Data

[63] Continuation of Ser. No. 810,638, Dec. 19, 1991, abandoned.

[51] Int. Cl.⁶ ............................................. H01H 37/76
[52] U.S. Cl. .................................... 307/29; 307/115; 307/125; 307/24; 327/525
[58] Field of Search ....................... 307/12, 24, 29, 31, 307/32, 38–40, 115, 125, 130, 131, 202.1, 465, 242, 243, 253, 254, 41, 18; 323/354; 340/825.84

[56] References Cited

U.S. PATENT DOCUMENTS

| | | | |
|---|---|---|---|
| 3,544,994 | 12/1970 | Hanson et al. | 307/242 X |
| 4,409,683 | 10/1983 | Woodward | 307/243 X |
| 4,686,384 | 8/1987 | Harvey et al. | 307/202.1 |
| 4,689,550 | 8/1987 | Ujihara et al. | 323/354 |
| 4,799,043 | 1/1989 | Ueda | 307/116 X |
| 4,912,339 | 3/1990 | Béchade et al. | 307/242 X |
| 5,130,574 | 7/1992 | Shen et al. | 307/243 X |

Primary Examiner—A. D. Pelllinen
Assistant Examiner—Fritz M. Fleming

[57] ABSTRACT

By providing data to a selection switch via a multiplexor so it can be programmed to supply either a current programmably controlled by a shift register or a current fixed by a fused resistor. Selected signals coupled to the multiplexor control the selection of either the resistor or the shift register thus, providing an improved current selection device which is capable of automatically selecting and programming the current supplied to circuits such as digital to analog converters.

18 Claims, 5 Drawing Sheets

PROGRAMMABLE DIGITAL TO ANALOG CONVERTER

This is a continuation of Ser. No. 07/810,638, filed Dec. 19, 1991, now abandoned.

DESCRIPTION OF THE INVENTION

This invention relates to a digital to analog converter (DAC) which utilizes a reference current and more particularly to a digital to analog converter in which the reference current can be permanently selected using fuses or programmably selected using multiplexors.

BACKGROUND OF THE INVENTION

Digital to analog converters hereinafter referred to as (DACs) are typically a plurality of current sources that can be set to determine a specified current at the output of the DAC. Resistor trimming is used to improve the accuracy and monotonicity of such DAC's.

Well controlled, fixed reference currents are often provided in electrical circuits by actively trimming a plurality of resistor values until the desired current level is obtained. A typical way of accomplishing this is taught, for example in U.S. Pat. No. 4,799,043, wherein there is disclosed a circuit resistance adjusting device for producing a combined resistance consisting of a plurality of resistances which are selectively connected by switching members containing fuses. Selected resistors are switched into the circuit by blowing a fuse to set a desired resistance level in the circuit.

In this patent however, the target current is permanently set, i.e., the connection of the resistors is fixed by the fuses, and once set is not restorable.

The present invention overcomes the difficulty of having fixed resistors by a circuit in which fuses may be set or blown to set a fixed target current in the device yet will permit the DAC output current to remain alterable if conditions require such an alteration.

The selectable control approach of the present invention particularly provides a low cost solution for such later altering. Also, because the circuit can be selectively programmed at different current levels it is useful in overall development design by providing a reduction in the overall time needed to develop a particular device as well as providing the means wherein the digital interface can still be utilized to later adjust the output if the initial setting proves inadequate.

Thus, the present invention permits field repair as resistance changes with time or if a resistor fails.

SUMMARY OF THE INVENTION

The present invention overcomes the difficulties of the prior art and provides a digital to analog converter (DAC) having a plurality of binary weighted current sources that can be programmed to produce optimum voltages and/or current levels.

In the present invention this is achieved by providing data to a selection switch via a multiplexor so that it can be programmed to supply either a current programmably controlled by a shift register or a current fixed by a fused resistor. Selected signals coupled to the multiplexor control the selection of either the resistor or the shift register.

An object of the present invention therefore is to provide an improved current selection device which is capable of automatically selecting and programming the current supplied to circuits such as digital to analog converters.

Another object of the present invention is to provide a digital to analog converter in which the currents established by fixed resistances can be overridden by a processor using variable signal source means, such as a shift register, in conjunction with switch selection means such as multiplexors.

The invention has a plurality of advantages in that it allows the digital to analog converter full current range to be measured before it is set to a selected current level while providing flexibility to override the selected current level if the need to do so arises.

Still other objects and advantages of the invention will become apparent from the following description taken in conjunction with the accompanying drawings in which:

DESCRIPTION OF THE PREFERRED EMBODIMENT

Figure 1:
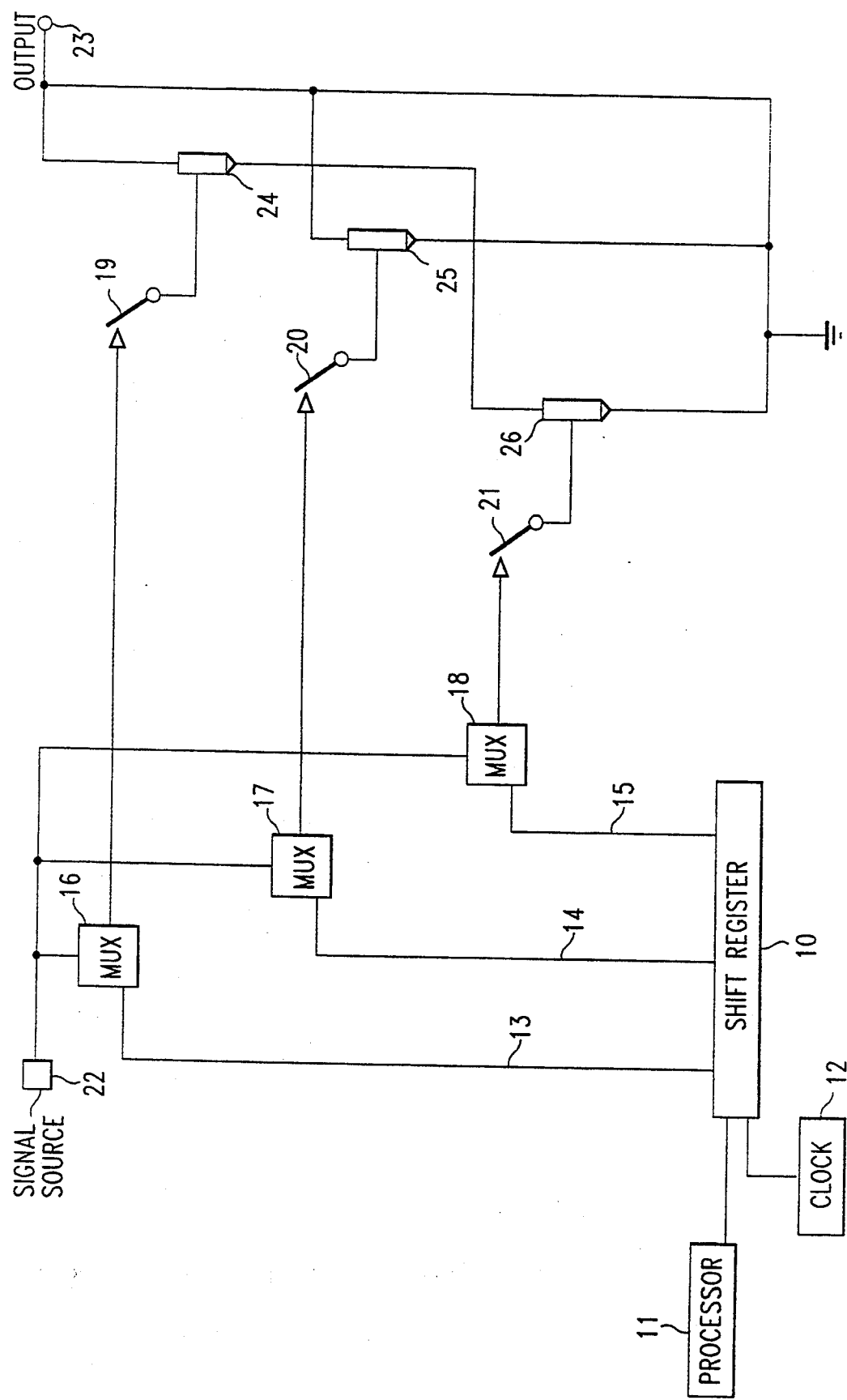
FIG. 1 shows a block diagram of the invention utilizing fuse elements as well as fused multiplexors to set the current in a digital to analog converter.

A circuit block diagram of the circuit of the present invention in accordance with a preferred embodiment of the invention is illustrated in FIG. 1. In this FIG. 1 a shift register 10, controlled by a processor element 11 and a clock 12, has its outputs 13, 14, and 15 directed into a plurality of respective fused multiplexor circuits 16, 17, and 18 whose outputs are in turn respectively connected to selection switches 19, 20, and 21 to set a selected current in the output 23. The multiplexors 16, 17, and 18 are also connected to a select signal source 22, and the circuit as described sets forth an architecture having any number of binary weighted current sources that can be either fixed in value or programmed in value by using either fuses or a process control shift register circuit to set a desired output current level.

Figure 2:
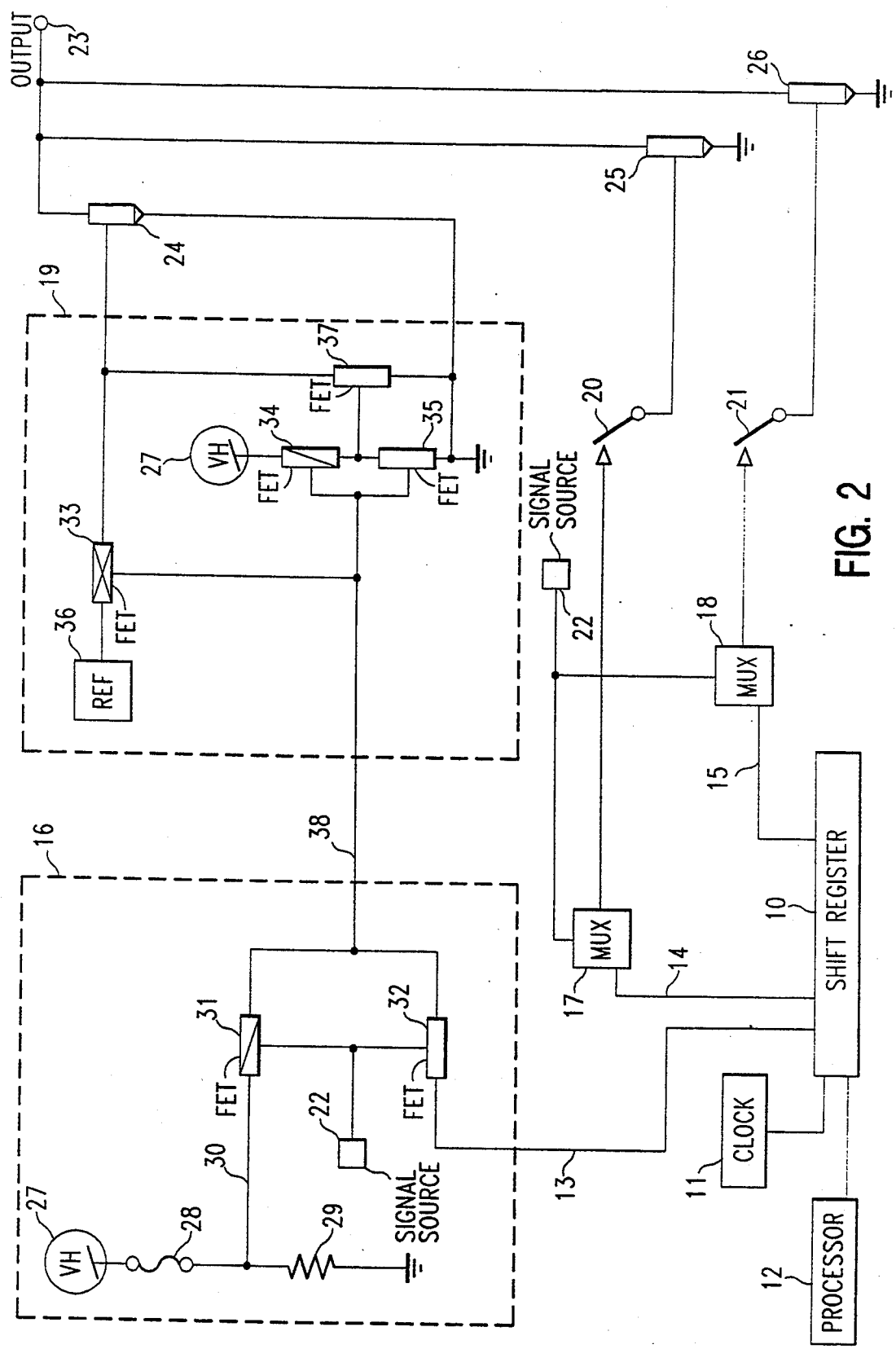
FIG. 2 is a more detailed schematic showing details of the fuse, the fused multiplexor and the selector switch used to set a reference current in the digital to analog converter.

Turning now to FIG. 2, a more specific detailed embodiment of the invention and its operation will be described.

In FIG. 2 there is shown details of the fused multiplexor 16 and the selection switch 19. In this FIG. 2 the multiplexor is comprised of a fuse 28 coupled between a voltage source 27 and a line 30 and to ground through a resistor 29. The line 30 is coupled to the output line 13 of the shift register 10 through a P-type FET 31 and an N-type FET 32 in series therewith. The gates of both FETs 31 and 32 are coupled to common source 22 of selection signals and their outputs are connected to a common line 38 leading to the selection switch 19.

The switch 19 is comprised of a reference current source 36 coupled through N-type FET 33 to the base of a bipolar transistor 24 whose collector is tied to the output 23 and whose emitter is connected to ground.

The gate of FET 33 is connected to line 38 and to the gates of a pair of FETs 34 and 35 arranged in series between voltage source 27 and ground. FET 34 is a P-type FET and FET 35 is an N-type FET. The junction between FETs 34 and 35 is connected to an N-type FET 37 whose source is connected to the base of transistor 24 and whose drain is connected to ground. The other multiplexor 17 and 18 are identical in configuration to multiplexor 16 and the selection switches 20 and 21 are identical, in configuration to switch 19.

CONDITION 1:

The fuse 28 remains unblown so that line 30 remains connected to positive voltage source 27. In this case if a positive signal is received at signal source 22 the transistor 31 remains off and transistor 32 becomes biased on so that a signal on line 13 from the shift register 10 will be applied to line 38. If the signal from the shift register 10 is negative then transistor 33 turns off and transistor 34 turns on. When transistor 34 turns on, the gate of transistor 37 rises towards the level of voltage source 27. This causes transistor 37 to turn on and pull the base of the transistor 24 to ground thus holding transistor 24 off and preventing transistor 24 from supplying any current to the output 23.

CONDITION 2:

Fuse 28 again remains intact so that line 30 is again at the voltage of source 27 and the signal on source 22 is again positive but the signal from the shift register 13 is positive. This positive signal from shift register 13 causes transistors 33 and 35 to turn on and transistor 34 to turn off. This permits the gate of transistor 37 to be pulled towards ground holding transistor 37 in an off condition. The base of the transistor 24 rises to the level of source 36 and causes transistor 24 to turn on and pull current from output 23.

CONDITION 3:

In this operation it will be assumed that the fuse 28 has been blown open so that there is no connection between source 27 and line 30.

Now, when a positive signal is received at source 22 the conditions remain as described above for Conditions 1 and 2 since transistor 31 remains off and the blown fuse has no effect.

OPERATION 4:

Again, it will be assumed that the fuse 28 has been blown, effectively holding line 30 near ground. Now when a negative signal is received at source 22 transistor 32 turns off and transistor 31 turns on setting line 38 to the same level as line 30. This causes transistor 34 to turn on and transistors 33 and 35 to turn off. When transistor 34 turns on transistor 37 also turns on because its gate becomes positive. When transistor 37 turn on transistor 24 is turned off and no current flows there through.

CONDITION 5:

In this case it would be assumed that the fuse 28 is intact. In this instance the line 30 is high since it remains coupled to source 27 by virtue of fuse 28. Now if source 22 goes negative, transistor 31 turns on and line 38 coupled to its source is pulled to the same high level as line 30 causing transistor 34 to turn off while transistors 33 and 35 turn on. When transistor 35 turns on, the gate of transistor 37 is pulled low so transistor 37 remains off permitting transistor 24 to turn on and draw current from output 23.

Similar actions occur in multiplexors 17 and 18 as described above. Thus, the current supplied to the output 23 can be individually varied depending upon the signal applied to the multiplexor from source 22 as well as the condition of the fuse (blown or unblown).

Figure 3:
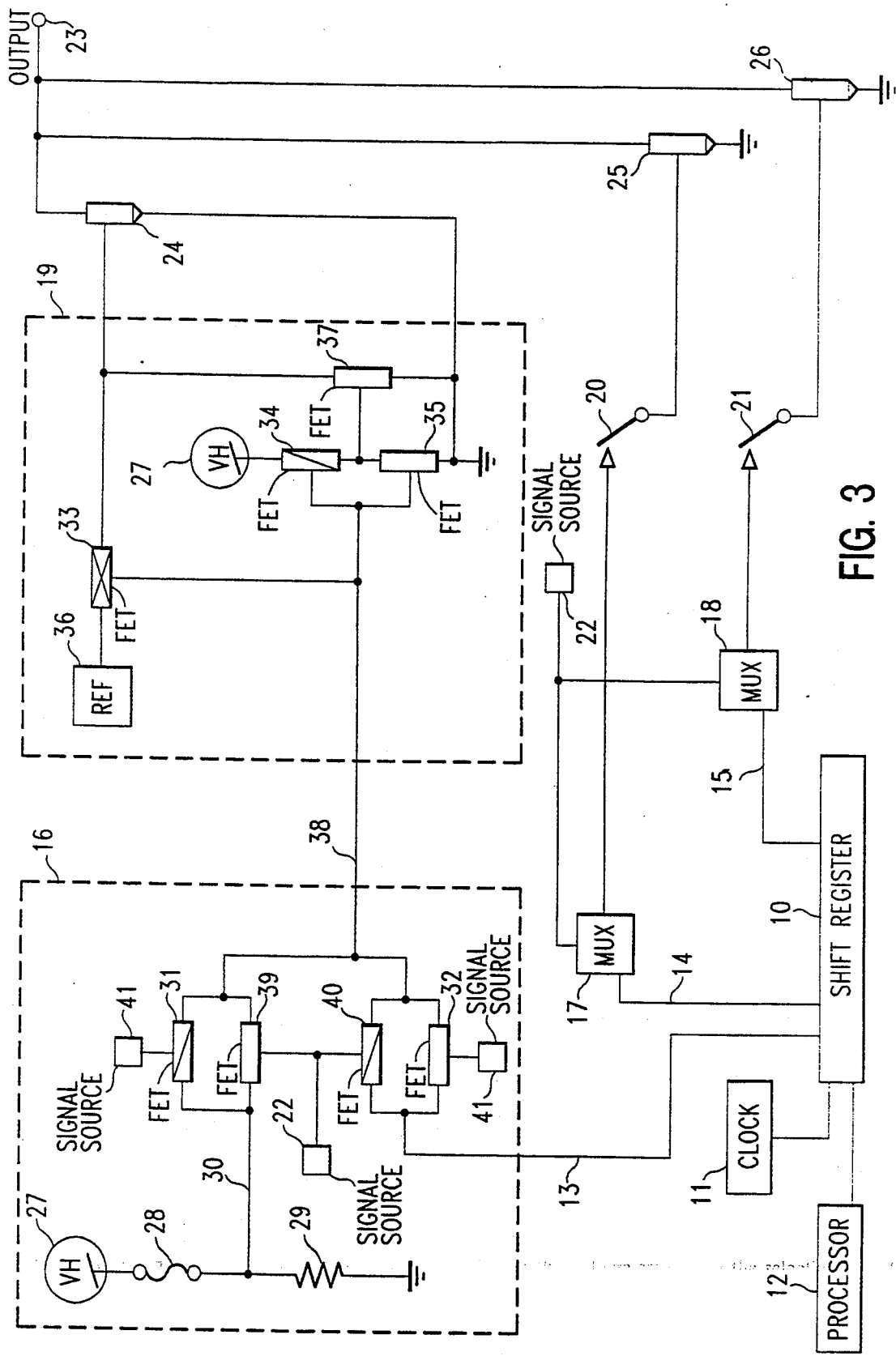
FIG. 3 is a modification of the embodiment shown in FIG. 2, wherein the circuit has been adapted for use with a complementary signal source.

FIG. 3 is substantially identical to FIG. 2 with the exception that the gate of transistor 31 is coupled to a source 41 providing signals complementary to that of source 22 and there is provided in parallel with transistor 31 an N-type transistor 39 whose gate is connected directly to the source 22. Similarly, the gate of transistor 32 is coupled to the signal source 41 complementary to source 22 and is in parallel with a P-type transistor 40 whose gate is coupled to the source 22. In this condition those complementary circuits are applied as both transistors in each pair are turned on or turned off simultaneously. This enhances the signal transfer characteristics from lines 13 and 30 to line 38. The remainder of the circuit operates in exactly the manner described above in conjunction with FIG. 2.

Figure 4:
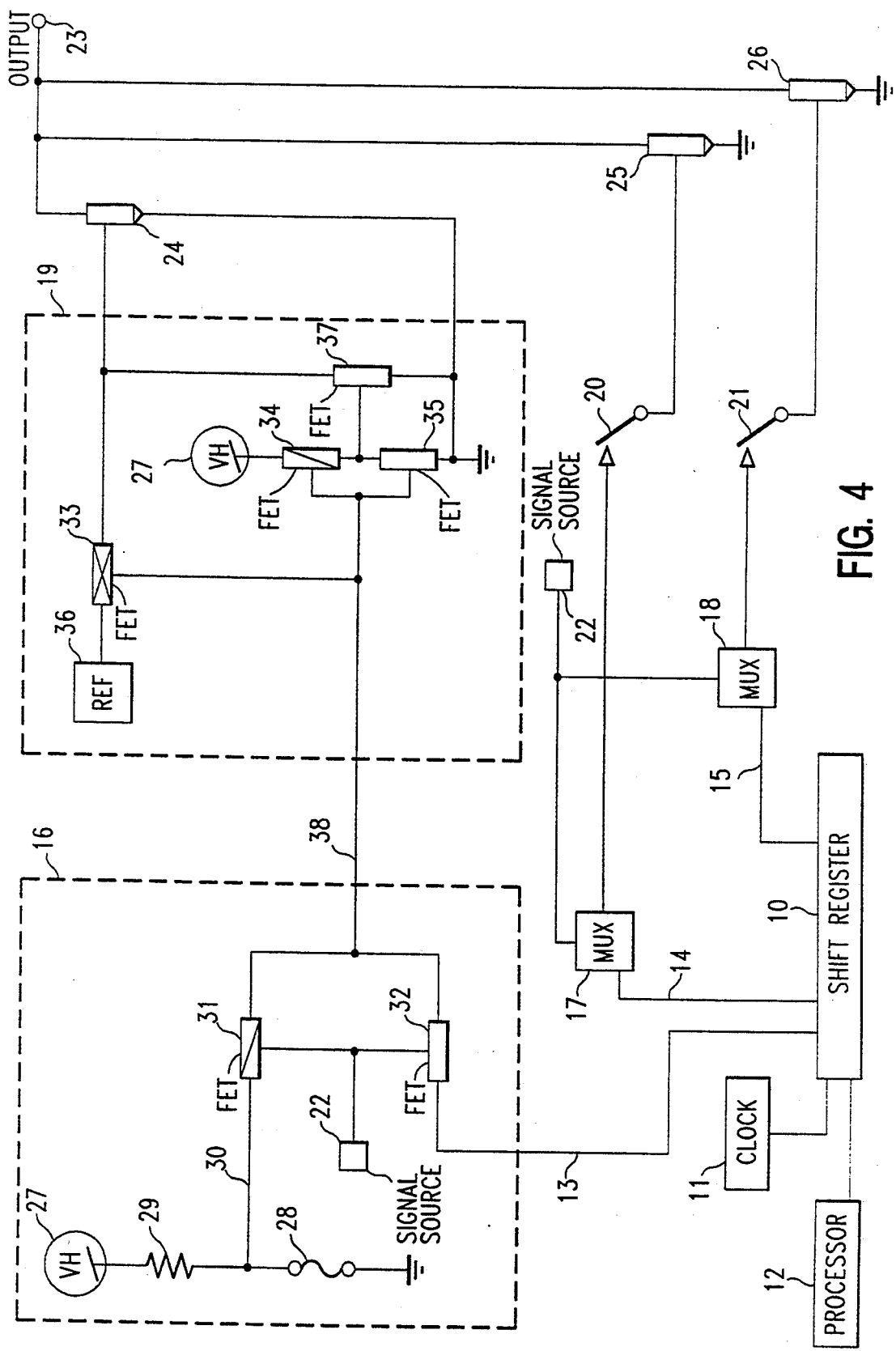
FIG. 4 is a modification of the multiplexor portion of the embodiment.

FIG. 4 is a modification of the multiplexor portion of the embodiment shown in FIG. 2 and is substantially identical to the multiplexor shown in FIG. 2 with the exception that the resistor 29 is connected between voltage source 27 and line 30 and the fuse 28 is located between the line 30 and ground.

Figure 5:
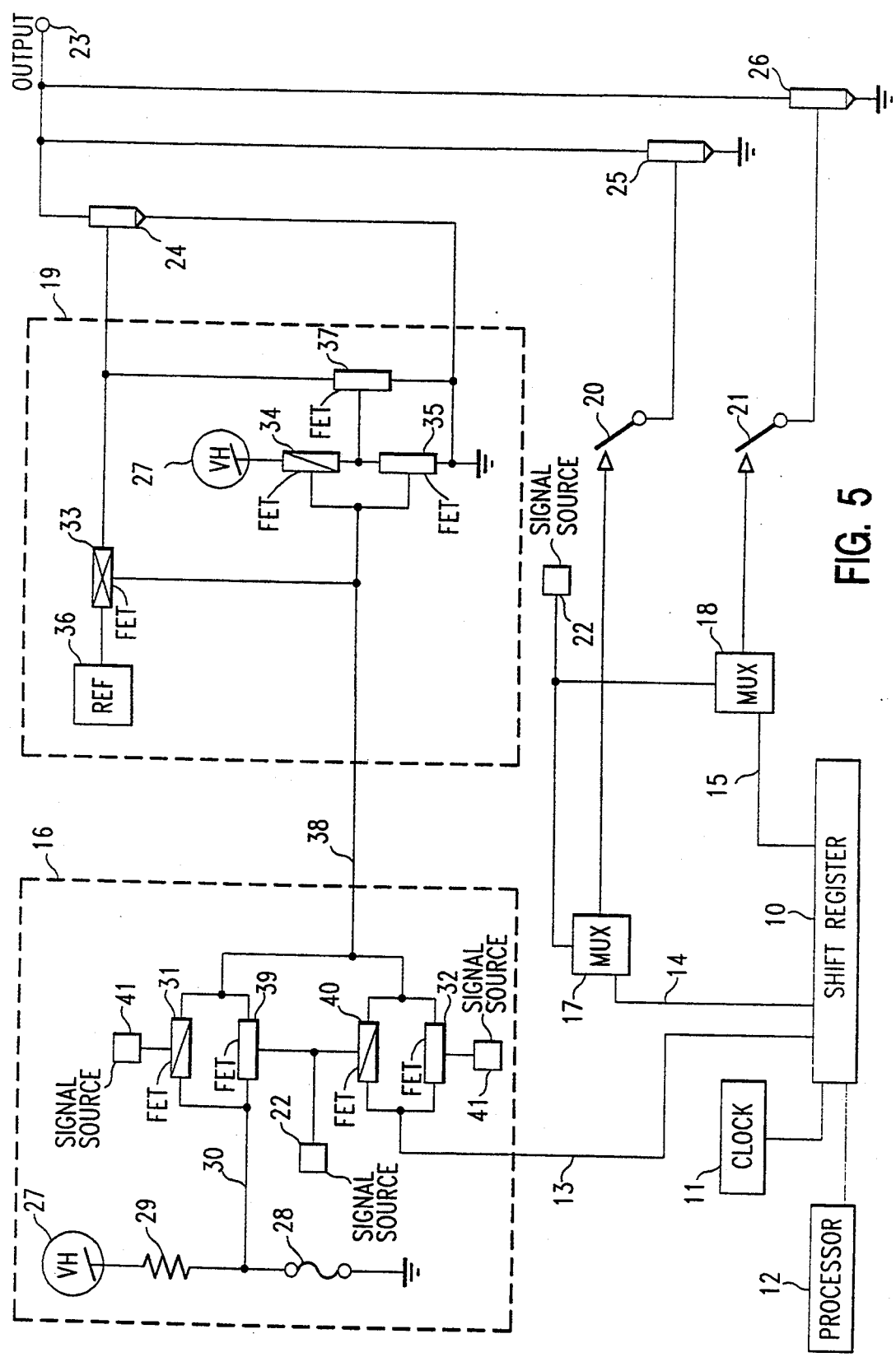
FIG. 5 is a modification of the multiplexor portion of the embodiment shown in FIG. 3.

FIG. 5 is a modification of the multiplexor portion of the embodiment shown in FIG. 3 and is substantially identical to the multiplexor shown in FIG. 3 with the exception that the resistor 29 is connected between voltage source 27 and line 30 and the fuse 28 is located between the line 30 and ground.

Having now described the invention it is respectfully submitted that it should now be obvious that other changes and modifications may be made in the circuit and that all the normal features of this invention have been described in turns of preferred embodiment and that omissions and substitutions may be made by those skilled in the art without departing from the spirit of the present invention.

What is claimed is:

1. A current setting digital to analog convertor circuit comprising:

a plurality of output transistors coupled to a common output, a clock driven shift register having a plurality of outputs, a respective programmable current selection circuit coupled between each of said respective one of said pluralities of shift register outputs and said plurality of output transistors, characterized by each of said programmable current selection circuits comprising, a multiplexor having an output, a first input coupled to a voltage source, a second input coupled to said shift register and means for selecting between said first and second inputs, and selection switching means coupled to the output of said multiplexor, including a current source, to either selectively turn on or turn off a respective one of said output transistors.

2. The circuit of claim 1 wherein each multiplexor can be selected to selectively couple either the second input coupled to the shift register or the first input coupled to the voltage sources to the selection switching means.

3. The circuit of claim 1 wherein said first input of said multiplexor is coupled to the voltage source through a fuse and to ground through a resistor.

4. The circuit of claim 1 wherein said first input of said multiplexor is coupled to the voltage source through a resistor and to ground through a fuse.

5. A current setting circuit having an output comprising:
- a shift register having a plurality of inputs and outputs,
- a clock coupled to a first input of said shift register for driving said shift register,
- a processor coupled to a second input of said shift register for controlling said shift register,
- a plurality of multiplexors, each multiplexor having an output, a pair of inputs, and means for selecting between said pair of inputs, and each multiplexor coupled to a respective output of said shift register,
- a plurality of switch selection circuits each having an output, and each switch selection circuit coupled to the output of a respective multiplexor, and
- a plurality of output transistors each coupled to the output of a respective switch selection circuit and to the output of the current setting circuit.

6. The circuit of claim 5 wherein said output transistors are bipolar transistors having an emitter, a base and a collector.

7. The circuit of claim 6 wherein all of said plurality of transistors have their emitters commonly coupled to ground, their collectors commonly coupled to the current setting circuit output and the base of each transistor is coupled to a respective switch selection circuit.

8. The circuit of claim 7 wherein each switch selection circuit includes a current source.

9. The circuit of claim 5 wherein in each said multiplexor, one of said pair of inputs is coupled to said shift register and the other of said inputs is coupled to a voltage source through a fuse and to ground through a resistor.

10. The circuit of claim 9 wherein said current setting circuit further includes a signal source coupled to each of said plurality of multiplexors for selectively coupling one of said inputs of said multiplexor to said output of said multiplexor.

11. The circuit of claim 10 wherein said signal source is a source providing complementary signals.

12. The circuit of claim 5 wherein said multiplexor includes a pair of inputs, one of said pair of inputs being coupled to said shift register and the other of said inputs being coupled to a voltage source through a resistor and to ground through a fuse.

13. A current setting digital to analog convertor circuit comprising:
- a plurality of output transistors coupled to a common output,
- a register having a plurality of outputs,
- a respective programmable current selection circuit coupled between each of said respective one of said pluralities of register outputs and said plurality of output transistors,
- characterized by each of said programmable current selection circuits comprising,
- a multiplexor having an output, a first input coupled to ground and, through a first selection means, to a voltage source, a second input coupled to said shift register, and second selection means for selectively switching between said first and second inputs, and
- selection switching means coupled to the output of said multiplexor, including a current source, to either selectively turn on or turn off a respective one of said output transistors.

14. A current setting circuit having an output comprising:
- a shift register having a plurality of inputs and outputs,
- a clock coupled to a first input of said shift register for driving said shift register,
- a processor coupled to a second input of said shift register for controlling said shift register,
- a plurality of multiplexors, each multiplexor having an output, a first and a second input, and means for selecting between said first and second input, said first input being coupled to means for selectively setting one of two distinct voltage levels thereon and said second input being coupled to a respective output of said shift register,
- a plurality of switch selection circuits each having an output, and each switch selection circuit coupled to the output of a respective multiplexor, and
- a plurality of output transistors each coupled to the output of a respective switch selection circuit and to the output of the current setting circuit.

15. The circuit of claim 14 wherein in each said multiplexor the first input is coupled to a voltage source through a fuse and to ground through a resistor.

16. The circuit of claim 15 wherein said current setting circuit further includes, in each of said plurality of multiplexors, a signal source for selectively coupling one of said inputs of said multiplexor to said output of said multiplexor.

17. The circuit of claim 16 wherein said signal source is a source supplying complementary signals.

18. The circuit of claim 14 wherein said means for selectively setting one of two distinct voltage levels thereon comprises a resistor coupled between said first input and a voltage source and a fuse coupled between said first input and ground.

* * * * *